United States Patent
Desu et al.

Patent Number: 5,496,437
Date of Patent: *Mar. 5, 1996

[54] REACTIVE ION ETCHING OF LEAD ZIRCONATE TITANATE AND RUTHENIUM OXIDE THIN FILMS

[75] Inventors: Seshu B. Desu; Wei Pan; Dilip P. Vijay, all of Blacksburg, Va.

[73] Assignees: Ceram Incorporated; Sharp Kabushiki Kaisha; Virginia Tech Intellectual Properties, Inc.

[*] Notice: The term of this patent shall not extend beyond the expiration date of Pat. No. 5,382,320.

[21] Appl. No.: 75,059

[22] Filed: Jun. 10, 1993

[51] Int. Cl.⁶ .................................................. H01L 21/3065
[52] U.S. Cl. ............................ 156/643.1; 216/6; 216/76
[58] Field of Search .................................. 156/643, 646, 156/664, 667; 216/6, 76

[56] References Cited

U.S. PATENT DOCUMENTS

| | | | |
|---|---|---|---|
| 4,963,701 | 10/1990 | Yasumoto et al. | 174/256 |
| 5,109,357 | 4/1992 | Eaton, Jr. | 365/145 |
| 5,185,689 | 2/1993 | Maniar | 361/313 |
| 5,254,217 | 10/1993 | Maniar et al. | 156/656 |

*Primary Examiner*—Olik Chaudhuri
*Assistant Examiner*—Thomas G. Bilodeau
*Attorney, Agent, or Firm*—Beaton & Folsom

[57] ABSTRACT

A method of reactive ion etching both a lead zirconate titanate ferroelectric dielectric and a $RuO_2$ electrode, and a semiconductor device produced in accordance with such process. The dielectric and electrode are etched in an etching gas of $O_2$ mixed with either $CClF_2$ or $CHClCF_3$.

10 Claims, 8 Drawing Sheets

5,496,437

REACTIVE ION ETCHING OF LEAD ZIRCONATE TITANATE AND RUTHENIUM OXIDE THIN FILMS

This invention was made with Government support under Grant N00014-90-J-1957 awarded by the Department of the Navy. The Government has certain rights in the invention.

FIELD OF THE INVENTION

The present invention relates to the field of producing a pattern on semiconductor devices and, in particular, to a method and system for reactive ion etching of lead zirconate titanate ("PZT") and ruthenium oxide ("$RuO_2$") thin films used in semiconductor devices such as a dynamic random access memory, using $CCl_2F_2$ or $CHClFCF_3$ with $O_2$ as an etch gas.

BACKGROUND OF THE INVENTION

Semiconductor devices such as a dynamic and nonvolatile random access memory ("DRAM") have decreased in size and increased in capacity dramatically over the last 20 years. As the capacity of memory cells has increased and the size has decreased, the design of the cells has become increasingly complex in order to preserve sufficient electrical capacitance to hold the electrical charge representing the stored data.

In the past silicon dioxide has been used as the dielectric in the capacitors of DRAM cells. However, silicone dioxide has a relatively low dielectric constant of about four. There has recently been experimentation with the use of other dielectric materials in order to increase the electrical capacitance in very small and complex cells. Some of this work has focused on the use of ferroelectric materials such as PZT as the dielectric in the capacitor. The relaxation properties of the PZT ferroelectric material produce an increase in the capacitance that is beyond what the dielectric constant would indicate. An example of such an approach is described in U.S. Pat. No. 5,109,357 by Eaton. Desirable materials for the electrodes associated with PZT capacitors include $RuO_2$, Pt and ITO. $RuO_2$ is especially desirable due to its high chemical stability, high electrical conductivity and its reduction of fatigue of PZT films. See, C. K. Kwok, D. P. Vijay and S. B. Desu, *Proceedings of the 4th International Symposium on Integrated Ferroelectrics*, Monterey, Calif. (1992).

Regardless of the material used as the dielectric in the capacitor of a DRAM, the cell surface must be patterned in some manner to produce the desired capacitor configuration. As mentioned, some of these capacitor configurations must be quite complex to achieve the necessary capacitance. PZT films have been patterned by laser-induced sputtering (see, M. Eyett, D. Bauerie, W. Wersing and H. Thomann, J. Appl. Phys. (62, 1511 (1987)), chemical wet etching (see, H. T. Chung and H. G. Kim, Ferroelectrics, 76 (1987)), ion milling and reactive ion etching (RIE). Preferably, the patterning technology can be performed at a rapid rate, produces a high resolution so that it can be used in complex capacitor configurations, and is highly uniform. RIE is particularly suitable because it produces a high etch rate at low etching power, high selectivity and good anisotropic profiles by appropriate selection of the reactive gas.

In ordinary RIE, material is selectively removed by an interaction with chemically reactive ion species created by a radio frequency ("RF") glow discharge maintained in the etching chamber. RIE normally involves covering the surface to be etched with a mask which leaves exposed the selected areas to be etched. The substrate is then placed into a chamber containing a chemically reactive gas such as $CF_4$ mixed with $O_2$. A plasma is produced by applying an RF potential across the gas to dissociate and form various species including positive and negative ions, reactive atoms such as fluorine, and radicals. This plasma reacts with the unmasked and exposed surface of the material to be etched to form volatile products which are removed to leave an etched profile.

One of the barriers to widespread use of PZT ferroelectrics as a dielectric in DRAM capacitors is the difficulty of etching such materials and their associate electrodes in an effective and efficient manner. The difficulty is compounded by the difficulty of identifying a suitable etch gas that can etch all three components of the PZT solid solution (PbO, $ZrO_2$ and $Ti_1O_2$) at an acceptable rate, and identifying a common etch gas for both the $RuO_2$ electrode or other electrode and the PZT ferroelectric material which will allow for stacked capacitor etching. Plasma etching of PZT thin films in $CF_4$ and HCl plasmas has been reported in M. R. Poor, A. M. Hurt, C. B. Fledermann and A. U. Wu, Mat. Res. Soc. Symp. Proc., 200 (1990). However, to obtain high etch rates, substrate heating was necessary in their process. RIE of $RuO_2$ with a $CF_4/O_2$ plasma has been reported in S. Saito and K. Kuramasu, Jpn. J. Appl. Phys. 31, 135 (1993). The use of $CF_4+O_2$ has been reported in RIE of $RuO_2$ (see, S. Saito and K. Kuramusa, Jpn. J. Appl. Phys. 31, 135 (1992)) and the use of $CCl_4$ has been reported in RIE of PZT (sese, S. Saito, et al., Jpn. J. Appl, Phys. 31, L1260 (1992)). $CCl_2F_2$ with $O_2$ has been used to etch both $RuO_2$ and PZT films, but $CCl_2F_2$ is believed to be environmentally damaging. Therefore, there is a need for an environmentally safe etching gas to use in RIE of $RuO_2$ and PZT films.

DETAILED DESCRIPTION OF THE INVENTION

Thin films of PZT where the ratio of zirconium by titanium in PZT is (53/47) were deposited to a thickness of 180–200 nm on Pt (500 nm) coated Si/SiO_2 substrates using the sol-gel/spin coating method. The PZT precursor was prepared from a metalorganic solution (0.4M) of lead acetate, zirconium n-propoxide and titanium iso-propoxide dissolved in acetic acid and n-propanol. Methods of preparing the precursor are known in the art, such as the method described in G. Yi and M. Sayer, Ceram Bulls 70(7), 1173 (1991). The coated films were annealed at 600° C. for 30 minutes to form the PZT perovskite phase.

Since the PZT solid solution consists of three components ($PbO$, $ZrO_2$ and $TiO_2$), the overall etch rate is dependent on the Zr/Ti ratio and the concentration of excess lead. This is because of the differing volatilities of the fluorides and chlorides of the constituent elements. Only the etch characteristics of PZT films with compositions close to the morphotrophic phase boundary were examined. No substrate heating was used to avoid the loss of the lead from the masked areas which could result in degradation of the films at high temperatures. The etching was performed on water cooled substrate holders to avoid excessive heating from the plasma. The critical etch parameters studied were the gas pressure, RF power and the effect of $O_2$ addition to the $CCl_2F_2$ plasma. Since the objective is to etch the complete ferroelectric stack capacitor in a single run, the etch rate of $RuO_2$ was also studied under the same conditions as the PZT films. The range of the values of the parameters were chosen so as to observe the general trends in etching of these films with varying conditions. The parameter values were also limited by the stability of the plasma.

Figure 1:
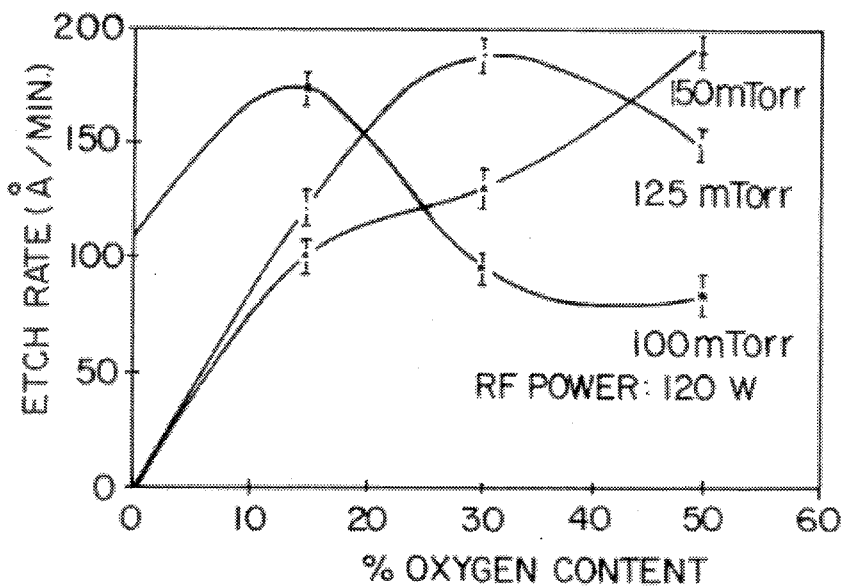
FIG. 1 is a graph showing etch rate versus percentage oxygen content at several chamber pressures.

FIG. 1 shows the effect of $O_2$ addition on the etch rate of PZT films at various gas pressures. In general, there is a peak in the etch rate with varying $O_2$ content at a particular gas pressure. At low gas pressures, it was found that the etch rate dropped significantly with increasing $O_2$ content in the chamber. The addition of $O_2$ in small amounts is known to enhance the etch rate in the case of $SiO_2$ etching, and so one might expect a mechanism of etching similar to that of $SiO_2$ in the present process. At lower gas pressures, it was found that the addition of small amounts of $O_2$ does enhance the etch rate of the PZT films, possibly by causing reduction in the recombination of the radicals. However, at higher $O_2$ content, the etch gas is diluted and therefore the etch rate is reduced. Addition of $O_2$ to the etch gas at high gas pressures tends to reduce the number of radicals participating in the etch process near the sheath region. The effective impact energy of the ions participating in the sputtering is therefore increased as a result of reduced collisions.

Figure 2:
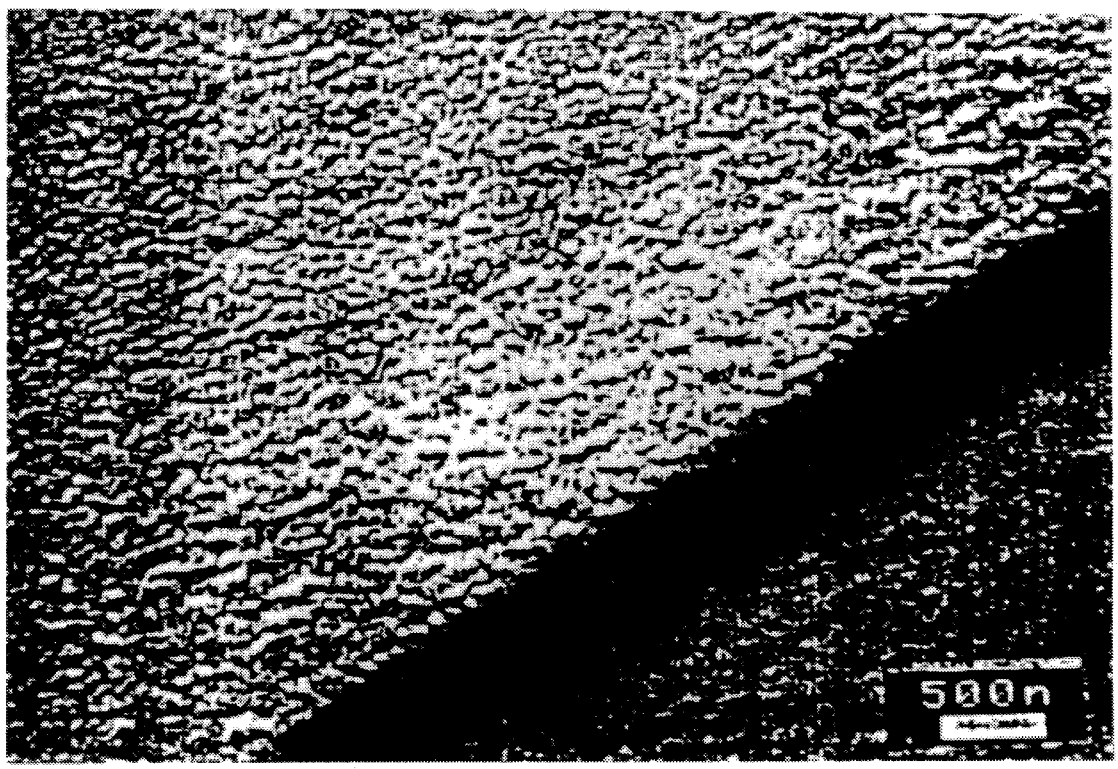
FIG. 2 is a SEM micrograph of a sample etched in accordance with the process of the present invention.

The etch anisotropy under various etching conditions was studied using a scanning electron microscope ("SEM"). FIG. 2 is an SEM micrograph of a sample etched under conditions of low gas pressure and low RF power. Under these conditions it was found that the etch profile is anisotropic. At high gas pressures and high RF power, the etch profile was more isotropic. Since the primary etch mechanism is by ion bombardment, one can expect high anisotropy at low gas pressures. However, at high RF power, the energy of the bombarding ions are very high, leading to significant damage of the etched surface.

Figure 3:
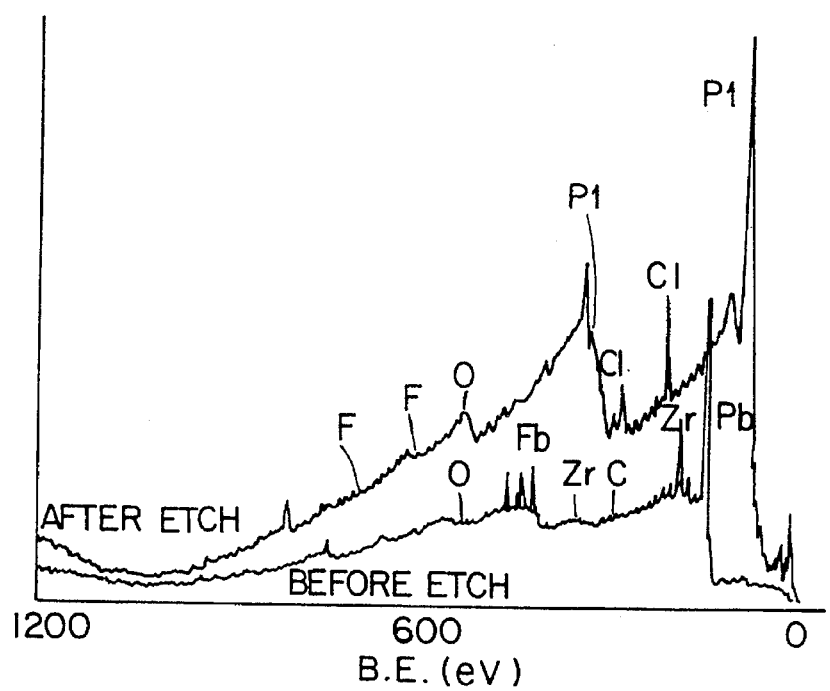
FIG. 3 is a comparison of an ESCA wide scan before and after the etch process of the present invention.

The composition of the etched surface was determined as a function of etch time using x-ray photoelectron spectroscopy ("XPS"). For this study, the etching was performed on a single sample (1 cm×1 cm) without any overlying mask. The etching was done under the conditions of 150 W RF power, 100 mTorr gas pressure and 15% $O_2$ content in the chamber. An initial surface analysis was performed on the sample before the etching process and subsequent analyses were done at predetermined intervals during etching. FIG. 3 is a comparison of the ESCA wide scan before and after the etch process. The components of the PZT solid solution clearly seem to be completely etched out at the end of the etch process. However, at the end of this process, Cl and F residues are present on the surface of the sample. These residues were removed easily by baking the sample at 100° C. for 30 minutes.

Figure 3A:
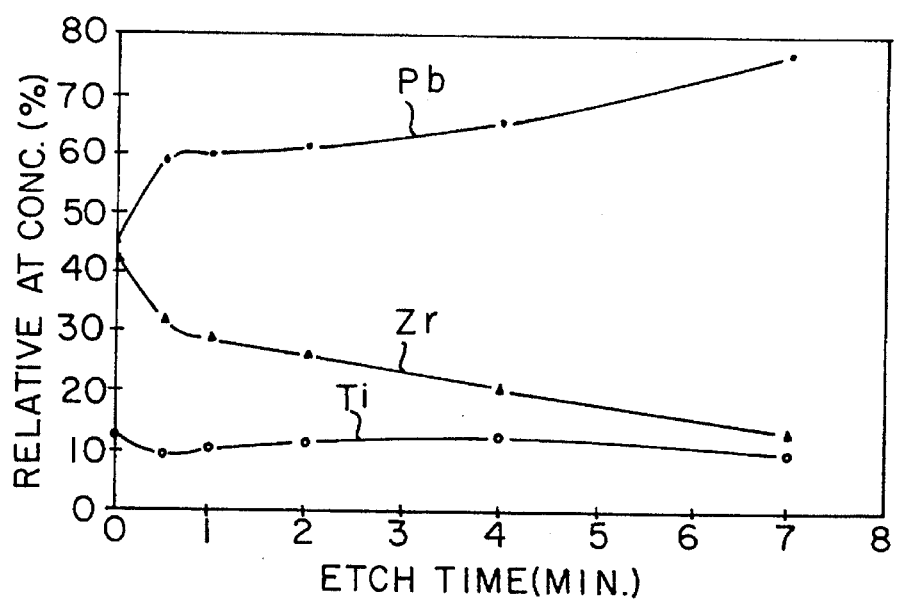
FIG. 3A is a graph of the relative atomic concentration of Pb, Zr and Ti as a function of etch time for etching in accordance with the present invention.

FIG. 3A is a plot of the relative atomic concentration of Pb, Zr and Ti as a function of etch time. The concentrations of these elements were determined using the standard-less ratio method (more details regarding this method can be obtained from S. B. Desu and C. K. Kwok, Mat. Res. Soc. Symp. Proc., 200, 267 (1990)). This plot is a clear indication of the relative etch rates of the three components in the PZT solid solution. Initially, the relative atomic concentration of Zr and Ti decreases quite rapidly. The narrow scan results show that after the first 30 seconds of etching under these conditions, there is a continuous decrease in the Zr concentration while the relative Ti concentration appears to be nearly constant. It is evident from FIG. 3A that the etch rate of PbO is the limiting factor in the etching of PZT thin films and therefore any post-etch residues are primarily due to PbO.

The chlorides of Zr, Ti and Pb have higher vapor pressures compared to the corresponding fluorides at the etching temperature (~100° C.) and therefore it is expected that the primary volatile by-products will consist of the chlorides. However, the actual presence of these compounds in the by-products was not identified experimentally. The vapor pressure of the chlorides decreases in the order of $TiCl_4 > ZrCl_4 > PbCl_2$.

Figure 4:
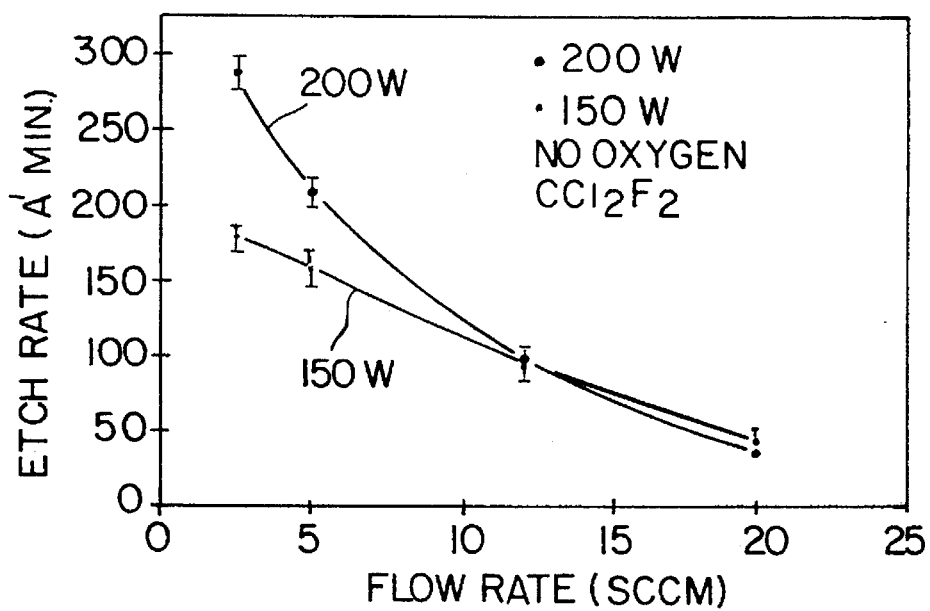
FIG. 4 is a graph of etch rate on PZT versus flow rate of etching gas.

FIG. 4 shows the trend in etch rate of PZT films with increasing flow rate of $CCl_2F_2$ gas in the etch chamber. The flow rate of the gas in the chamber was not independent of the gas pressure and therefore its effect on the etch rate it a direct indication of the gas pressure effects. The etching was performed at fixed RF power values of 150 W and 200 W. As can be seen from FIG. 4, the etch rate decreases with increasing flow rate of the gas. Also, at low flow rates, higher etch rates are observed at higher RF power. The RF power does not have any significant effect on the etch rate at high flow rates. Typical etch rates obtained under conditions of low flow rates and high power were in the range of 20–30 nm/minute. The decreasing trend of the etch rate with increasing flow rate indicates that the primary mechanism of etching in these films is by an ion bombardment. At high gas pressures/flow rate there is a decrease in the sheath potential and thereby a reduction in the number of ions participating in the etch process. In effect, this decreases the energy of ion bombardment and, consequently, the etch rate.

Figure 5:
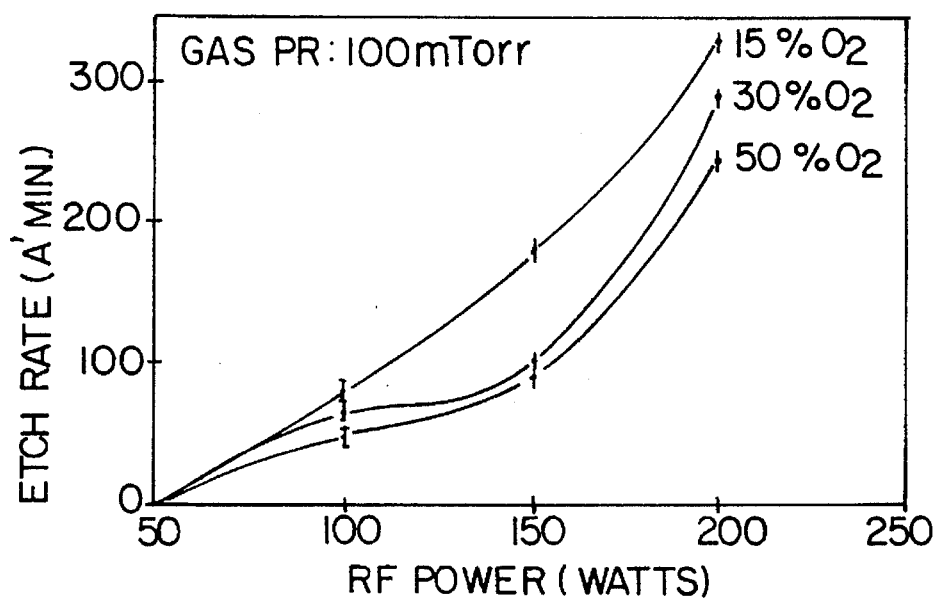
FIG. 5 is a graph of etch rate on PZT versus RF power.

The effect of RF power on the etch rate of PZT films is shown in FIG. 5. In general, the etch rate increased with increasing RF power. It is well known that with an increase in the RF power, the sheath potential and the concentration of the reactive ions increase. The effect of gas pressure on the etch rate at different power values does suggest that the increase in etch rate with RF power is due to the increase in sheath potential. The notable feature, however, is the actual value of the etch rate. At a gas pressure of 100 mTorr, $O_2$ content of 15% and RF power of 200 W, an etch rate of the order of 30 nm/min was obtained. At lower gas pressures and higher power, however, the plasma was very unstable.

RuO$_2$ thin films were reactively sputtered to a thickness of 200 nm onto Si/SiO$_2$ in an argon-oxygen ambient at a gas pressure of 10 mTorr and a substrate temperature of 200° C. The films were etched after suitable masking using positive photoresist in a RIE-1C (Samco) etcher. The thickness of material etched was determined using a WYKO 3D profilometer. The surface composition before and after the etch was determined using XPS and the etch anisotropy was evaluated using SEM.

Figure 6:
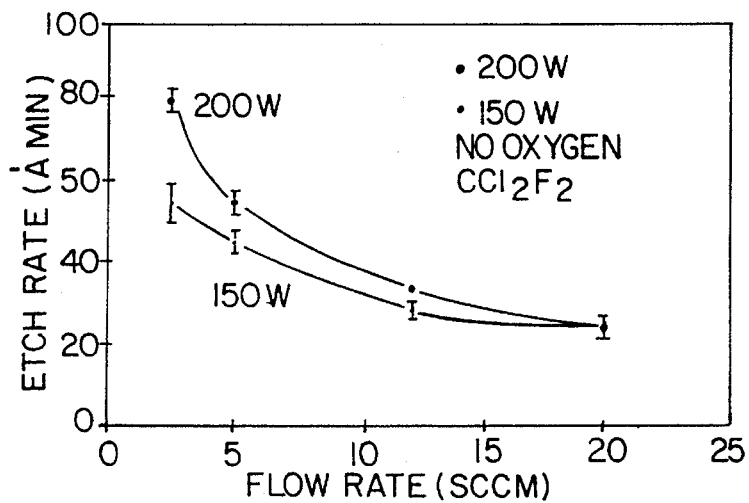
FIG. 6 is a graph of etch rate on $RuO_2$ versus etching gas flow rate.
Figure 7:
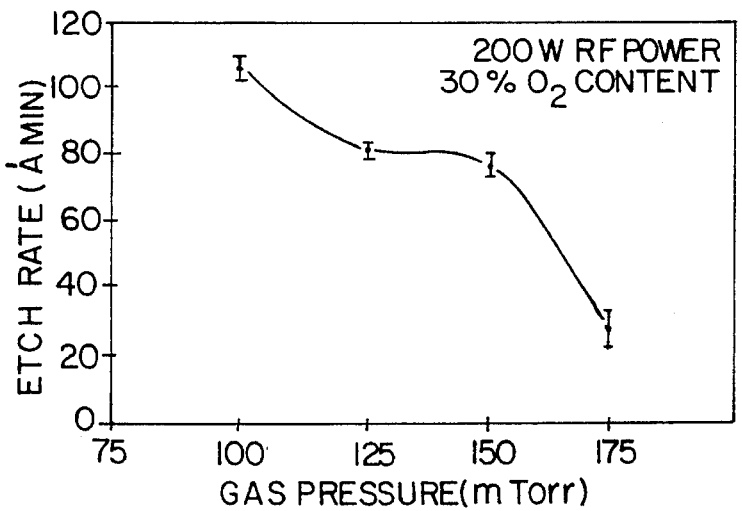
FIG. 7 is a graph of etch rate versus etch gas pressure.
Figure 8:
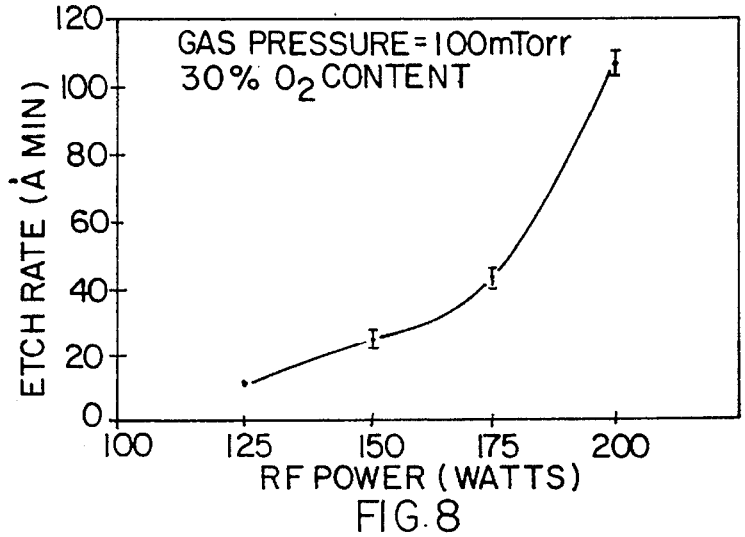
FIG. 8 is a graph of etch rate on $RuO_2$ versus RF power.

The etching of RuO$_2$ thin films were studied under similar reactor configuration and etching conditions. In the past, Saito, et al., supra, have investigated the reactive ion etching characteristics of MOD RuO$_2$ thin films using CF$_4$/O$_2$ plasma. They have reported that RuO$_3$ and RuF$_5$ are volatile compounds that form as by-products during the etching of RuO$_2$. FIG. 6 shows the effect of increasing flow rate/gas pressure on the etch rate of RuO$_2$ thin films at two different RF power value in pure CCl$_2$F$_2$ gas. As in the case of PZT films, the etch rate decreases with increasing gas pressure, indicating that ion-bombardment effects are responsible for the etching of these films. The actual values of the etch rates were, however, significantly lower than that of the PZT films. Typically, without any O$_2$ addition in the chamber, etch rates of the order of 7.5–8.0 nm/minute were obtained at low gas pressures and high power. With the addition of O$_2$ (30%) to the etch gas, as shown in FIG. 7, there was a considerable amount of increase in the etch rate at lower gas pressures. RuO$_2$ can react with oxygen ions in the plasma to produce volatile RuO$_3$/RuO$_4$. The ion derivatives of the CCl$_2$F$_2$ gas are responsible only for bombardment/sputtering of the reaction products. It is unlikely that fluoride and chloride derivatives of Ru will form as by-products in significant amounts in comparison to RuO$_3$/RuO$_4$ because of the relatively higher boiling point of the former. In the absence of any O$_2$ in the etch gas, the etching process is an ion-induced phenomena as evident from the gas pressure effects. This is also confirmed by the RF power effects on the etch rate, as shown in FIG. 8. When O$_2$ is added to the etch gas, the etching mechanism becomes an ion-enhanced phenomena. The bombarding ions assist in the reaction of O$_2$ with RuO$_2$ films and in the removal of the by-products formed thereafter.

If the capacitor is to be etched in a single run, then the only concern regarding the selectivity in the etching process is between the bottom electrode and the substrate. High selectivity can be obtained by etching the RuO$_2$ bottom electrode in an O$_2$ enriched plasma. Since ion bombardment effects are primarily responsible for the etching of PZT and RuO$_2$ films, it is favorable to use a low gas pressure and high RF power to obtain high rates. However, the RF power needs to be optimized to obtain high antisotropy without any mask damage.

In a related process, PZT films were deposited on Pt/Ti/SiO$_2$/Si (2"×2") substrate by metalorganic decomposition (MOD) method. The PZT precursor was a metalorganic solution (0.5M) of lead acetate, zirconium n-propoxide and titanium iso-propoxide dissolved in n-propanol. The solution was spin coated on the substrate at 2000 rpm for 40 seconds and subsequently dried at 130° C. for 3 minutes. This spin-bake cycle was repeated until the desired thickness of 2000A was obtained. The coated PZT films were annealed at 650° C. for 30 minutes to form the perovskite phase.

RuO$_2$ films with thickness of 2000Å were reactively sputtered onto SiO$_2$/Si (2"×2") in an argon-oxygen atmosphere at a gas pressure of 10 mTorr and a substrate temperature of 200° C. The films were subsequently annealed at 600° C. for 30 minutes in air to form stoichiometric composition and to relieve the stress.

Positive photoresist patterns (Shipley 1350J, 1.5 μm) were used as etching masks for PZT and RuO$_2$ samples. These patterns could be removed by organic solvent after etching and etched steps were left on the sample surfaces. The step heights were measured by a WYKO 3D surface profile meter. The etch rates were determined by dividing the step heights by etching time. Meanwhile, the etch endpoint was also observed directly.

Figure 9:
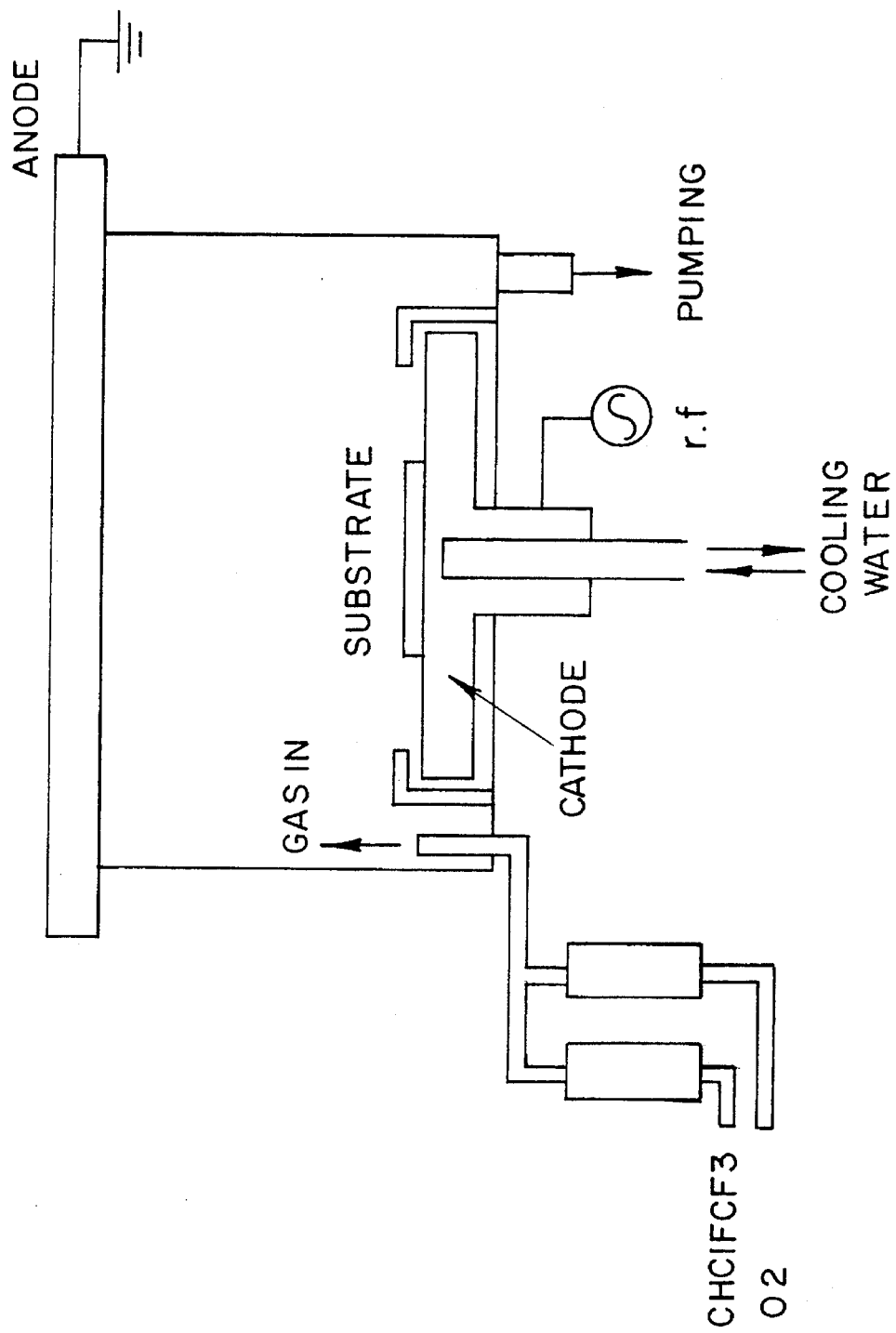
FIG. 9 is a schematic diagram showing an apparatus for practicing the present invention.

The RIE system used in the present study for PZT and RuO$_2$ etching was a SAMCO RIE-1C rf diode compact etcher with electrode separation of 5 cm and cathode area of 113 cm$^2$ shown schematically in FIG. 9. Both the cathode and etching samples were water cooled during the etching process.

Figure 10:
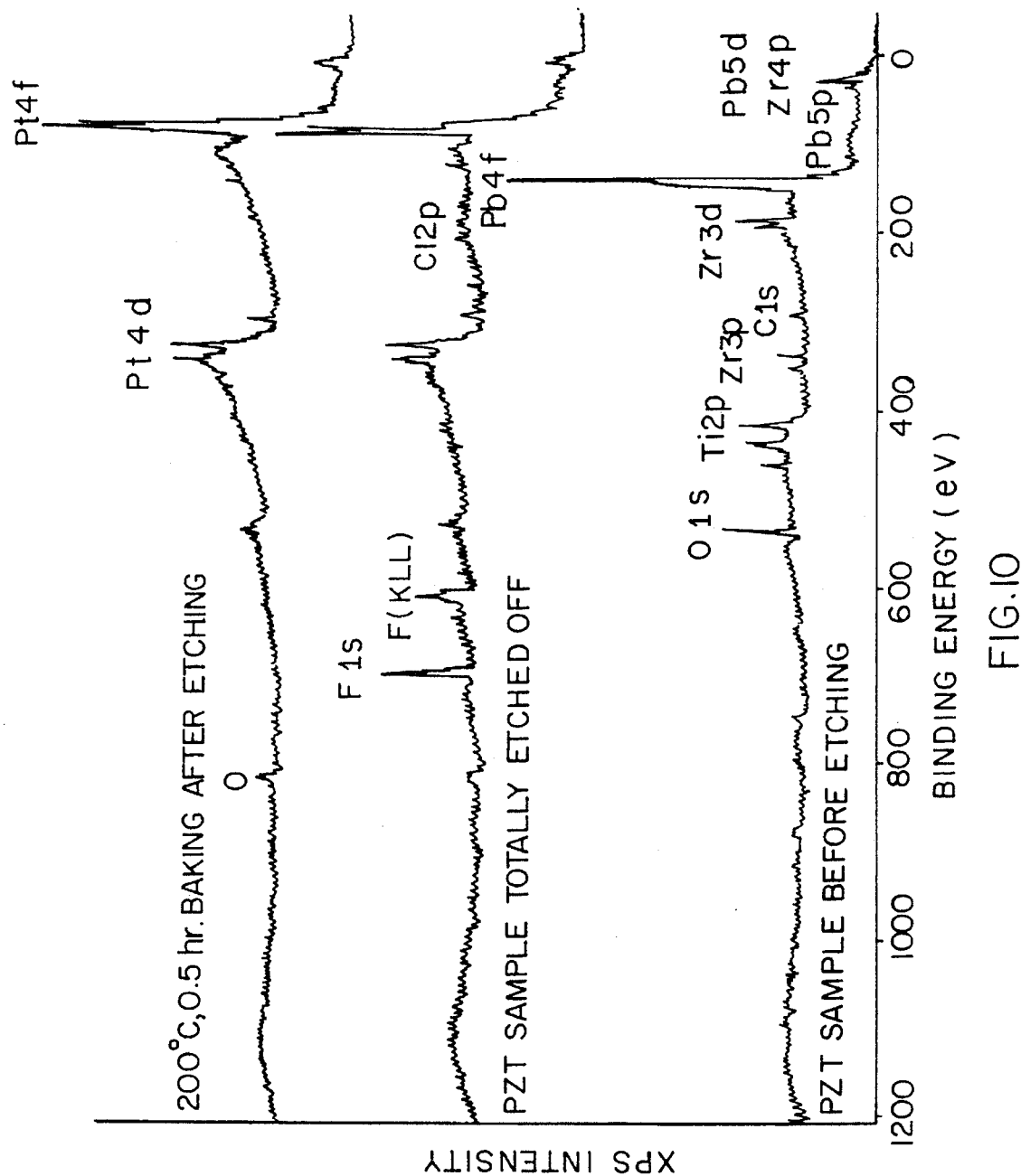
FIG. 10 is a graph of XPS intensity versus binding energy at several etch steps.

FIG. 10 shows a typical XPS wide scan spectrum for PZT films intermediately and totally etched by CHClFCF$_3$ gas. The spectrum shows that the residual substances were mainly fluorine or fluorides, since the fluoride derivatives of Pb, Zr, and Ti have much lower vapor pressure than those of chloride derivatives under both regular and reduced pressure. Since fluoride derivatives have much higher melting and boiling points compared to chlorides, they did not evaporate during the etching process. Therefore, fluorine was identified as a non-reactive radical in this particular case and became surface residuals which could be totally removed by baking after etching as seen in FIG. 10. On the other hand, the chlorine or chlorine containing clusters were considered as reactive species that could react with PbO, ZrO$_2$ and TiO$_2$ at the surface with the help of ion bombardment and form removable volatile by-products. These energetic ions or ion clusters were directly generated in plasma and then accelerated by the sheath potential (self-bias, V$_{sb}$). The bombardments of those particles with high kinetic energy (caused by V$_{sb}$) activated and enhanced the reactions on the surface of the sample. Ion bombardment not only increased the surface reaction rate by increasing the concentration of active species but also sputtered off surface-absorbed fluorine or fluorinated organic layers to leave a fresh surface for further reaction.

The plasma etching (PE) of PLT films has been studied in the absence of ion bombardment and it has been found that appreciable etch rates could be obtained only at elevated substrate temperature (300° C.) (see, M. R. Poor et al., Mat. Res. Soc. Symp. Proc., 200, 211 (1990)). The self-bias effect in the RIE of Si has also been studied (see Y. Liu and M. C. Flowers, Vacuum, 42 No. 18, 1213 (1991)). An RIE rate equation has been proposed by considering the self-bias effect on the basis of Arrhenius equation:

$$ER = k + F(V_{sb}) + [Cl^*] exp(-E_a/RT_s) \quad (1)$$

where T$_s$ is the temperature of the sample surface, E$_a$ is the activation energy for the reaction, k is a term that represents the effective rate of transport of Cl* to the surface and F(V$_{sb}$)=1+σV$_{sb}$ is a self-bias factor that represents the effect of the bias on the etch rates. Under PE conditions ions strike the surface only with thermal energies [F(V$_{sb}$)=1]; therefore the etch rate largely depends on the surface temperature of the sample shown as follows:

$$ER = k[Cl^*] exp(-E_a/RT_s) \quad (2)$$

Figure 11:
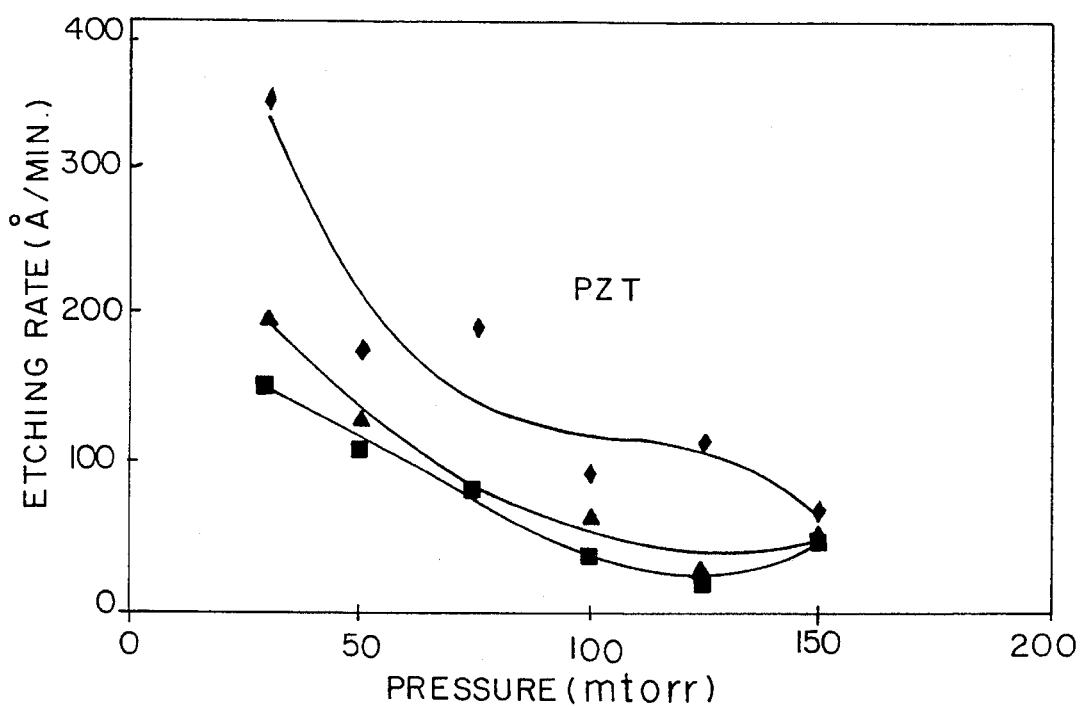
FIG. 11 is a graph of etch rate of PZT versus etching gas pressure.
Figure 12:
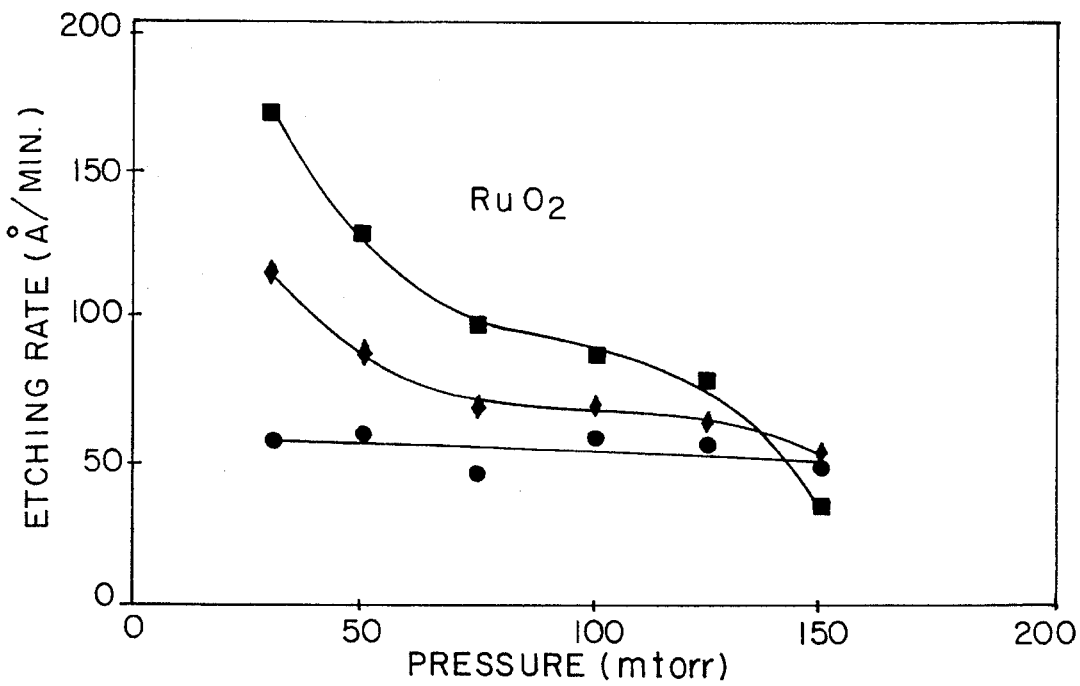
FIG. 12 is a graph of etch rate of $RuO_2$ versus etching gas pressure.

In the current rf diode power controlled RIE system, V$_{sb}$ decreased with increasing gas pressure (See, B. Chapman, *Glowing Discharge Process*, a Wiley Interscience Publication (1980) and K. Wasa and S. Hayakaw, *Handbook of Sputtering*, Nayes Publication (1992)); so do the surface reaction rates and etch rates. Besides, the increase in gas pressure reduced the mean free path (equivalent to k in the above equations) of ions and clusters. Hence, surface reactions decreased. Therefore, it is expected that the gas pressure would have significant effect on etch rates. FIG. 11 and FIG. 12 show the trend in etch rates of PZT and $RuO_2$ films with increasing total gas pressure at fixed rf power of 150 watts. These data fit the equation (1) very well.

Figure 14:
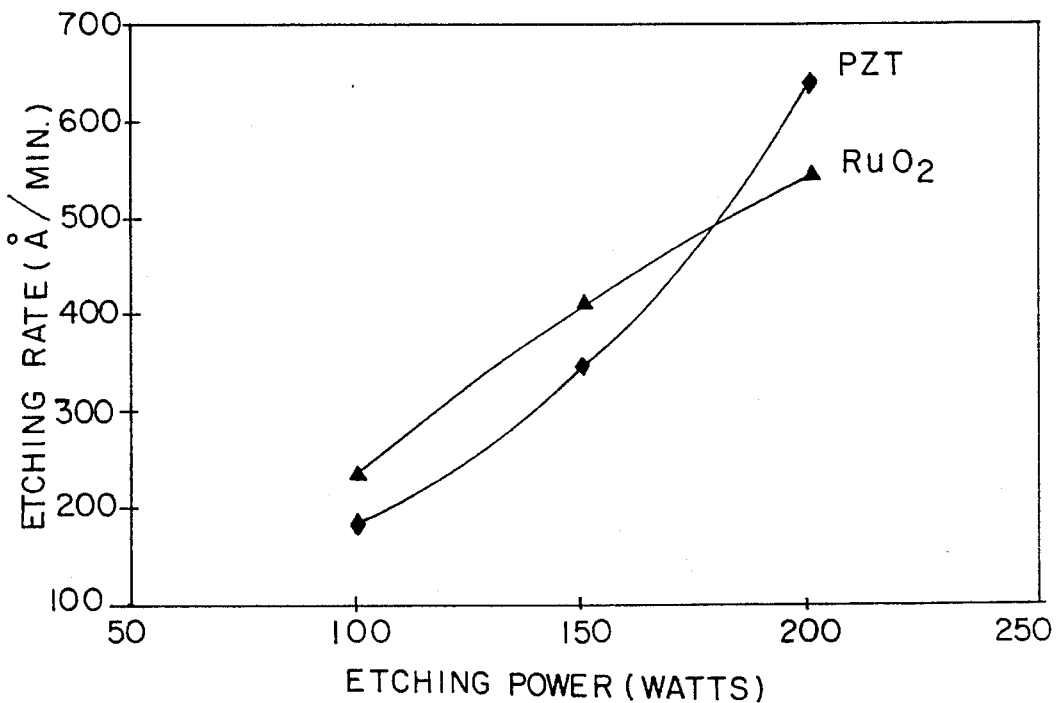
FIG. 14 is a graph of etch rate of both PZT and $RuO_2$ versus RF power.

The effect of rf power on the etch rates of PZT and $RuO_2$ films are shown in FIG. 14. In each gas composition studied, the etch rate increased with increasing rf power, because the sheath potential and the concentration of the reactive ion increased with an increase in the rf power.

Figure 13:
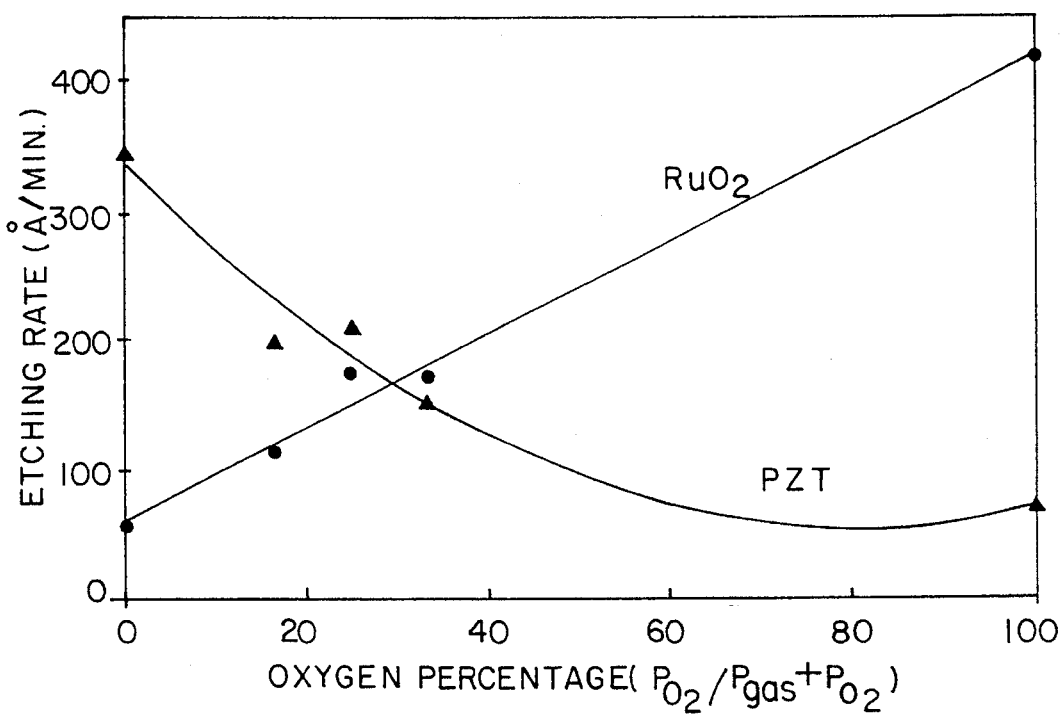
FIG. 13 is a graph showing the etch rate ratio of PZT and $RuO_2$ films as a function of oxygen percentage.

Oxygen addition effects on the RIE of PZT and $RuO_2$ were also studied. As can be seen in FIG. 11 the etch rates of PZT films decreased with increasing oxygen concentration in the etching gas. (The circle data shows 0% $O_2$, the diamond data shows 17% $O_2$, and the square data shows 33% $O_2$. All were at 150 watts RF power.) The etch rate decreased because O* was not a reactive radical in PZT etching. The presence of oxygen diluted the etching gas rather than increasing the [Cl*] concentration (represents chlorine or chlorine containing radicals) because only one chlorine existed in $CHClCF_3$. FIG. 12 shows the increase in etch rates of $RuO_2$ films with increasing oxygen concentration. (The circle data shows 0% $O_2$, the diamond data shows 17% $O_2$, and the square data shows 33% $O_2$. All were at 150 watts RF power.) Also, it is noted that the highest etching rate was obtained under pure oxygen plasma. In the case of RIE of $RuO_2$ films, O* might play a vital role. According to Saito, et al., supra, $RuO_4$ and $RuF_5$ have been identified as volatile by-products during the RIE of $RuO_2$. In addition, $RuO_4$ has relatively lower boiling point (40° C.) and consequently higher vapor pressure compared to $RuF_5$. Therefore, O* radical may have higher degree of reactivity compared to Cl* and F* react with $RuO_2$ to form the volatile substance $RuO_4$ in RIE of $RuO_2$. Since the addition of oxygen affected the RIE rates of PZT and $RuO_2$ films in a different way, selective etching o± PZT on $RuO_2$ electrodes was feasible. FIG. 13 shows the large etch rate ratio (ERR) of PZT and $RuO_{0\ 2}$ films obtained by controlling the oxygen percentage.

The etch anisotropy and etched surface morphology under various etching conditions was studied using SEM. Under the conditions of lower gas pressure and lower etching power the etched step tended to be more anisotropic. The etched surface, however, showed more smooth with the increasing of oxygen percentage and decreasing of the etching power.

What is claimed is:

1. A method of reactive ion etching a material that includes at least one of $RuO_2$ and lead zirconate titanate, comprising: placing the material into a chamber, the chamber containing $CHClCF_3$, and producing a glow discharge in the chamber to etch the material.

2. The method of claim 1, wherein the material includes both $RuO_2$ and lead zirconate titanate.

3. The method of claim 2, wherein the glow discharge is produced by radio frequency.

4. The method of claim 3, wherein the radio frequency power is between 125 and 200 watts.

5. The method of claim 1, wherein the chamber includes $O_2$.

6. The method of claim 5, wherein the $O_2$ content in the chamber is between 10% and 50% of the total gas content in the chamber.

7. The method of claim 5, wherein the gas pressure in the chamber is less than about 175 mTorr.

8. A method of patterning a semiconductor device that includes at least one of $RuO_2$ and lead zirconate titanate, comprising: applying a mask over the material which covers a portion of the material and leaves exposed another portion of the material, placing the material with the applied mask into a chamber including $CHClCF_3$, and producing a glow discharge in the chamber to reactively ion etch the exposed portion of the material.

9. The method of claim 8, wherein the device includes both lead zirconate titanate and $RuO_2$, and the lead zirconate titanate functions as a dielectric and the $RuO_2$ functions as an electrode.

10. The method of claim 8, wherein the glow discharge is produced by radio frequency.

\* \* \* \* \*